United States Patent [19]

Kaplan et al.

[11] 4,307,178

[45] Dec. 22, 1981

[54] PLASMA DEVELOMENT OF RESISTS

[75] Inventors: Leon H. Kaplan, Yorktown Heights; Steven M. Zimmerman, Wappingers Falls, both of N.Y.

[73] Assignee: International Business Machines Corporation, Armonk, N.Y.

[21] Appl. No.: 145,163

[22] Filed: Apr. 30, 1980

[51] Int. Cl.$^3$ .......................... G03C 5/18; G03C 5/34
[52] U.S. Cl. .................................... 430/296; 156/643; 430/191; 430/325; 430/326
[58] Field of Search ............... 156/643; 430/159, 176, 430/191, 296, 297, 299, 313, 323, 325, 326, 328

[56] References Cited

U.S. PATENT DOCUMENTS

| | | | |
|---|---|---|---|
| 3,705,055 | 12/1972 | Christensen et al. | 430/328 |
| 3,867,216 | 2/1975 | Jacob | 156/643 |
| 4,007,047 | 2/1977 | Kaplan et al. | 430/323 |
| 4,132,586 | 1/1979 | Schaible et al. | 156/643 |
| 4,201,579 | 5/1980 | Robinson et al. | 430/323 |
| 4,241,165 | 12/1980 | Hughes et al. | 430/296 |

FOREIGN PATENT DOCUMENTS

| | | | |
|---|---|---|---|
| 51-73389 | 6/1976 | Japan | 156/643 |
| 54-27369 | 1/1979 | Japan . | |
| 679923 | 8/1979 | U.S.S.R. | 430/326 |

OTHER PUBLICATIONS

"Pattern/Mask Generation Trends" Semiconductor International, Jul.-Aug. 1979, pp. 9, 10.
IBM Technical Disclosure Bulletin, vol. 21, No. 3, Aug. 1978, "Aluminum Etch Mask for Plasma Etching", Blakeslee et al. pp. 1256-1258.
IBM Technical Disclosure Bulletin, "Process for Obtaining Undercutting of a Photoresist to Facilitate Lift Off", by Canavello et al., vol. 19, No. 10, Mar. 1977.

*Primary Examiner*—P. E. Willis, Jr.
*Attorney, Agent, or Firm*—Henry Powers

[57] ABSTRACT

Exposed patterns in phenol-formaldehyde Novolak resin/diazo ketone resist layers are developed in an oxygen plasma by treating the resist layers, prior to development, with a magnesium salt. This produces a negative pattern. Positive patterns are produced by combining the process with decarboxylation of the exposed areas followed by blanket exposure.

11 Claims, No Drawings

PLASMA DEVELOMENT OF RESISTS

BACKGROUND OF THE INVENTION

This invention relates generally to a radiation sensitive resist development process and more particularly to a dry development process for resist.

A positive resist system in use today for microlithography applications is composed of an alkali soluble polymer, such as a phenol-formaldehyde Novolak resin and a diazo ketone sensitizer. Such sensitizers and resists are described, for example, in U.S. Pat. Nos. 3,046,118; 3,046,121; 3,106,445; 3,201,239 and 3,666,473; which are hereby incorporated by reference. Exposure to radiation causes the exposed portions of the resist to become soluble in alkaline solutions and normally the resist image is developed in an alkaline aqueous solution. The use of wet developers can result in problems, such as the attack by the alkaline solution on substrate materials such as aluminum, poor profile control, adhesion loss and development bias and tolerance. Recently, dry development techniques have been proposed in which a cold reactive plasma or glow discharge is used in order to selectively remove either the exposed or the unexposed portions of the resist layer. A difficulty in accomplishing dry development is that the plasma removal rates for exposed and unexposed resist are normally not very different.

BRIEF SUMMARY OF THE INVENTION

We have now found a process by which either positive or negative resist patterns can be developed in a Novolak resin/diazo ketone resist layer by the use of an oxygen plasma.

In accordance with the invention, a patterned resist image is formed on a substrate by coating a layer of a phenol-formaldehyde resin/diazo ketone resist material on the substrate and patternwise exposing the layer to radiation. Magnesium compounds are incorporated into the layer, and the layer is placed in an oxygen containing cold plasma, so as to preferentially remove portions of the resist layer.

The magnesium compounds are conveniently incorporated into the layer by treatment of the layer with a solution of a magnesium salt.

Magnesium is preferentially incorporated into the exposed areas which then become resistant to plasma etching so that a reversal or negative image results when the usual exposure and development sequence is followed for the normally positive acting resist.

Positive, as well as negative, images can be formed by the use of, for example, the technique for reversal development, which is described in U.S. Pat. No. 4,007,047, in conjunction with the process of the invention.

DETAILED DESCRIPTION

The foregoing and other objects, features and advantages of the invention will be apparent from the following more particular description of preferred embodiments of the invention.

The positive resists which are useful in the process of the invention include an alkali soluble resin. Examples of such resins are prepolymerized phenol-formaldehyde resins which can be prepared by the acid or base catalyzed condensation of formaldehyde with an excess of a phenol having the formula

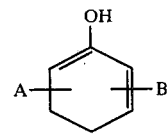

where (A) and (B) are selected from the group consisting of hydrogen and alkyl groups containing one to six carbon atoms.

Suitable sensitizers are diazo ketones having diazo and keto groups at adjacent positions on the molecule, such as the naphthoquinone-(1,2)-diazide sulfonic acid esters which are described in U.S. Pat. No. 3,201,239 which have the general formula

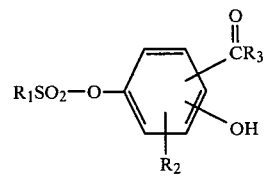

in which $R_1$ is a naphthoquinone-(1,2)-diazide radical, $R_2$ is selected from the group consisting of hydrogen and hydroxyl, and $R_3$ is selected from the group consisting of hydrogen, alkyl, aryl, alkoxy, aryloxy, amino, and heterocyclic groups. Examples are also described in U.S. Pat. No. 3,046,118 which have the general formula;

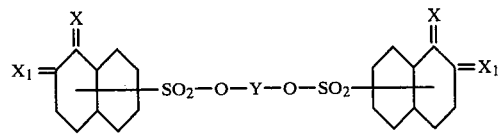

in which X and $X_1$ are $N_2$ or O, those attached to the same ring being different, and Y is an organic linkage containing at least one arylene, substituted arylene or heterocyclic radical; U.S. Pat. No. 3,046,121, which have the general formula;

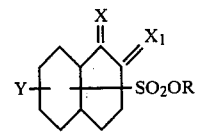

in which X and $X_1$ are selected from the group consisting of $N_2$ and O and are different. Y is selected from the group consisting of hydrogen and halogen and R is a substituted or unsubstituted aryl or heterocyclic radical; and U.S. Pat. No. 3,106,465 which have one of the general formulae;

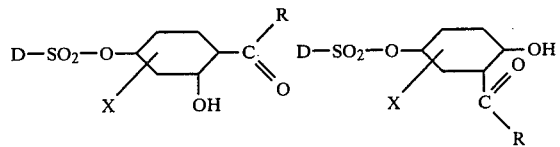

wherein D stands for a naphthoquinone-(1,2)-diazide radical, X stands for a member selected from the group consisting of H and OH. R stands for a member selected from the group consisting of hydrogen, $OR_1$, $NR_2R_3$, alkyl-, aryl- and heterocyclic radicals, $R_1$ stands for a member of the group consisting of alkyl and aryl, $R_2$ and $R_3$ stand for a member of the group consisting of hydrogen, alkyl and aryl, $R_2$ equalling $R_3$ or being different from $R_3$. Examples of such compounds are the 2, 3, 4-trihydroxybenzophenone esters of 1-oxo-2-naphthalene-5 sulfonic acid. The sensitizers are conventionally employed in amounts of from about 12 to 30% by weight of the resin components of the resist formulation.

The resist components are dissolved in an organic solvent or solvent mixture so that the resist can be coated as thin layers on various substrates. Suitable solvents include, for example, ethers, esters, and ketones such as methyl or ethyl cellosolve acetate, with or without minor amounts of butyl acetate and xylene; glycol monomethyl ether, glycol monoethyl ether, bis-2-methoxyethyl ether (diglyme); and aliphatic ketones such as methyl isobutyl ketone and acetone. The solids content of the resist solutions conventionally ranges from about 10 to 40% by weight.

According to conventional procedure, when the resist layer is exposed to radiation such as actinic light or electrons, some of the sensitizer is converted from a base insoluble to a base soluble form. The adjacent diazo ketone groups are believed to form a carboxyl group which makes the exposed sensitizer molecules base soluble. A positive relief image is developed by treating the resist layer with an alkaline solution such as either an aqueous solution of a mixture of sodium metasilicate, sodium phosphate and sodium ortho phosphate or dilute KOH which solutions preferentially remove the exposed portions of the layer.

According to the process of the invention, magnesium ions are caused to react, probably by salt formation, with the exposed sensitizer which makes the exposed portions of the resist layer resistant to an oxygen containing plasma atmosphere so that the unexposed portions are preferentially removed. A reversal or negative image results in the resist layer. A preferred method of incorporating the magnesium into the resist layer is to treat the layer, after radiation exposure, with an aqueous solution of metal salt. Depending upon the exposure dosage and the resist layer thickness, several cycles, rather than a single sequence, of metal salt treatments and oxygen plasma etching may be needed to completely develop the resist image down to the substrate surface while maintaining the contrast between the exposed and unexposed portions. In other words, to assure the presence of the amount of resist layer thickness which must remain in order to properly mask the substrate.

Alternate methods of incorporating the magnesium compounds are to mix them with the resist before coating or to implant magnesium ions into the layer. After exposure, the magnesium in the unexposed portions is then leached out by a soak in water or a mildly alkaline aqueous (pH about 8–9) solution.

Magnesium salts which are soluble in water to provide no more than a mildly alkaline (pH 8–9) solution can be used. Such salts include, for example, magnesium acetate, magnesium benzoate, magnesium chloride, magnesium bromide, magnesium fluoride, magnesium iodide, magnesium nitrate, magnesium bromate and magnesium sulfate. A higher concentration of salt in the water facilitates the incorporation of the magnesium ions into the resist so that the more soluble salts are preferred in the practice of the invention, for example magnesium acetate. The concentration of the salt solution will depend upon the solubility of the individual salt and, in any case, a less than completely saturated solution is employed. The treatment times will depend upon the temperature and the concentration of the salt. The treatment should swell but not attack the resist layer. It has been found that elevated temperatures up to about 90° C. facilitate the incorporation of the magnesium ions into the resist layer.

The development is carried out in a glow discharge or a cold plasma in a low-pressure atmosphere containing oxygen. Various types of glow discharge apparatus can be employed in the practice of the invention, including electrodeless or barrel reactors and reactors containing electrodes in the low-pressure glow discharge chamber such as parallel plate, or diode reactive ion etchers, as are known in the art. The pressure and power used will depend upon the equipment employed with the pressures chosen so as to obtain a uniform plasma. The power should be chosen to obtain the best contrast, and it is found that low powers in the range below about 50 watts are preferred for this purpose. The process of the invention is further illustrated by, but is not intended to be limited to, the following example.

EXAMPLE 1

Oxidized, 57 mm in diameter, silicon wafers having an 800 Å thick silicon dioxide layer, are spin-coated with a resist layer having a dry thickness of about 1 micron. The resist is a mixture of a phenol-formaldehyde Novolak resin and about 17 percent by weight of resin of the 2-diazo-1-oxo-naphthalene-5-sulfonic acid diester of dihydroxybenzophenone. The resist layer is baked at a temperature of about 85° C. for twenty minutes in order to remove the diglyme solvent, and the resist layer is patternwise exposed to a scanning electron beam to provide an exposure dosage of 20 micro coulombs/$cm^2$. The exposed resist layer is soaked in a solution of 600 grams/liter of magnesium acetate tetrahydrate having a pH of about 9 at a temperature of 85° C. for twenty minutes, rinsed in deionized water and blown dry. The wafers are placed in a low-pressure glow discharge in an oxygen atmosphere at a pressure of about 150 microns and a power of about 25 watts for twenty minutes. In this example, a Tegal "Plasmod" stripper was used. The process of magnesium solution soak and plasma treatment was repeated four or five times in order to remove the unexposed portion of the resist layer down to the surface of the oxide. Measurements of the resist profile with a taly step showed that about 0.52 of the original 1.0 micron of resist thickness remained after development or a film thinning ratio (FTR) of about 2.1.

The example illustrates that even with a relatively low (when compared to optical or actinic light exposure), electron beam exposure dosage process a film thinning ratio of better than 2:1 was achieved. With optical exposure, more of the sensitizer would be converted and it would be expected that even greater contrast can be achieved. The example provides a reversal development in that the originally exposed portions of the resist layer remain. In order to obtain a positive resist image in which the originally exposed areas are removed, the process, for example, of U.S. Pat. No. 4,007,047 can be used.

According to this process, after the pattern-wise exposure of the resist layer, the resist layer is treated with a mildly acidic aqueous solution and then the entire layer is exposed with actinic radiation before the magnesium salt treatment of the layer. In this case, magnesium compounds will be incorporated into the originally unexposed portions of the resist layer which are then rendered plasma resistant so that the originally exposed layers are preferentially removed when the layer is subjected to the oxygen plasma treatment.

The process provides for the development of resist layers using a plasma. Although aqueous solutions are employed, they are non-reactive and do not attack underlayers such as aluminum, and, in fact, would not normally contact a completely exposed substrate surface even in the multi-treatment cycle embodiment of the process of the invention.

We claim:

1. A process for producing a patterned resist image on a substrate comprising the steps of:
   coating a layer of a phenol-formaldehyde/diazoketone resist material on said substrate;
   patternwise exposing said layer to radiation;
   reacting said resist layer with magnesium ions, and
   contacting the layer with an oxygen containing plasma so as to preferentially remove portions of said layer.

2. The process of claim 1 wherein the magnesium ions are incorporated into said layer by soaking said layer in an aqueous solution of a magnesium salt.

3. The process of claim 2 wherein multiple cycles of soaking said layer in said aqueous solution and contacting said layer with an oxygen-containing plasma are used.

4. The process of claim 3 wherein said magnesium salt is magnesium acetate tetrahydrate.

5. The process of claim 1 wherein said radiation is a scanning electron beam.

6. The process of claim 1 wherein said radiation is actinic light.

7. The process of claim 1 wherein the unexposed portions of said layer are preferentially removed when said layer is contacted with said oxygen-containing plasma.

8. The process of claim 2 wherein after pattern-wise exposing said layer to radiation, said layer is contacted with a mildly acidic aqueous solution and then the entire layer is exposed with actinic radiation so that the magnesium salt are incorporated into the originally unexposed portions of said layer so that the exposed portions of said layer are preferentially removed when said layer is contacted with said oxygen-containing plasma.

9. The process of claim 2 wherein said oxygen-containing plasma is created by an electrodeless discharge in an oxygen atmosphere at a pressure of about 150 microns and power of about 25 watts.

10. The process of claim 1 wherein said magnesium ions are incorporated into said layer by ion implantation.

11. The process of claim 1 wherein said magnesium ions are incorporated in said resist by pre-mixing therein a water soluble ionizable magnesium salt prior to said coating on said substrate.

* * * * *